United States Patent
Song et al.

(10) Patent No.: US 7,205,576 B2
(45) Date of Patent: Apr. 17, 2007

(54) LIGHT EMITTING DEVICE AND METHOD OF MANUFACTURING THE SAME

(75) Inventors: June-o Song, Gwangju-si (KR); Dong-seok Leem, Gwangju-si (KR); Tae-yeon Seong, Gwangju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/930,915

(22) Filed: Sep. 1, 2004

(65) Prior Publication Data

US 2005/0051783 A1     Mar. 10, 2005

(30) Foreign Application Priority Data

Sep. 8, 2003  (KR) .............. 10-2003-0062830

(51) Int. Cl.
*H01L 33/00* (2006.01)
(52) U.S. Cl. .............. 257/94; 257/96; 257/98; 257/102; 257/103
(58) Field of Classification Search ........... 257/94, 257/96, 98, 102, 103, 97
See application file for complete search history.

(56) References Cited

U.S. PATENT DOCUMENTS

| | | | |
|---|---|---|---|
| 6,593,597 B2 | 7/2003 | Sheu | |
| 6,603,146 B1 | 8/2003 | Hata et al. | |
| 6,794,690 B2 * | 9/2004 | Uemura | 257/183 |
| 6,797,987 B2 | 9/2004 | Chen | |
| 6,869,820 B2 | 3/2005 | Chen | |
| 6,936,859 B1 * | 8/2005 | Uemura et al. | 257/99 |
| 7,005,684 B2 * | 2/2006 | Uemura et al. | 257/99 |

FOREIGN PATENT DOCUMENTS

| | | |
|---|---|---|
| KR | P-1999-0088218 | 12/1999 |
| KR | 10-2002-0026737 A | 4/2002 |

OTHER PUBLICATIONS

Korean Office Action for Application No. 10-2003-0062830, dated Aug. 30, 2005, and translation.
European Search Report issue in Corres. EP 04255416 on Oct. 27, 2006, The Hague, The Netherlands.

(Continued)

*Primary Examiner*—Gene M. Munson
(74) *Attorney, Agent, or Firm*—Buchanan Ingersoll & Rooney PC

(57) ABSTRACT

A light emitting device and a method of manufacturing the same are provided. A light emitting device has a structure wherein a substrate, an n-type clad layer, a light emitting layer, a p-type clad layer, an ohmic contact layer, and a reflective layer are successively stacked. The ohmic contact layer is formed by adding an additional element to an indium oxide. According to the light emitting device and the method of manufacturing the same, the characteristics of ohmic contact with a p-type clad layer is improved, thus increasing the efficiency and yield of wire bonding during packaging FCLEDS. Also, it is possible to increase the light emitting efficiency and life span of light emitting devices due to the low contactless resistance and the excellent electric current and voltage characteristic.

6 Claims, 5 Drawing Sheets

OTHER PUBLICATIONS

Gessmann, T., et al., "*GaInN light-emitting diodes with omni directional reflectors*", Proceedings of the SPIE—The International Society for Optical Engineering, Jul. 2003, pp. 139-144, vol. 4996, SPIE, USA.

Kim, D.W., et al., "*A study of transparent indium tin oxide (ITO) contact to p-GaN*", Thin Solid Films, Nov. 2001, pp. 87-92, vol. 398-399, Elsevier Sequoia, The Netherlands.

Aliyu, Y.H., et al., "*AlGaInP LEDs using reactive thermally evaporated transparent conducting indium tin oxide (ITO)*", Electronics Letters, Dec. 7, 1995, pp. 2210-2212, vol. 31, No. 25, IEE, Stevenage, England, GB.

Horng, Ray-Hua, et al., "*Low-resistance and high-transparency Ni/indium tin oxide ohmic contacts to p-type GaN*", Applied Physics Letters, Oct. 29, 2001, pp. 2925-2927, vol. 79, No. 18, American Institute of Physics, Melville, NY, US.

* cited by examiner

LIGHT EMITTING DEVICE AND METHOD OF MANUFACTURING THE SAME

BACKGROUND OF THE INVENTION

This application claims the priority of Korean Patent Application No. 2003-62830, filed on Sep. 8, 2003, in the Korean Intellectual Property Office, the disclosure of which is incorporated herein in its entirety by reference.

1. Field of the Invention

The present invention relates to a light emitting device and a method of manufacturing the same, and more particularly, to a light emitting device having a reflective electrode structure wherein ohmic characteristics are improved and a method of manufacturing the light emitting device.

2. Description of the Related Art

It is important to construct an ohmic contact structure between a semiconductor and an electrode in manufacturing a light emitting device such as a light emitting diode and a laser diode employing a nitride semiconductor, for example, a gallium nitride (GaN) semiconductor. Presently, commercially available GaN light emitting devices are mostly constructed on a sapphire ($Al_2O_3$) substrate.

Such GaN light emitting devices are classified into top-emitting light emitting diodes (TLEDS) and flip-chip light emitting diodes (FCLEDS).

TLEDS emit light through an ohmic contact layer in direct contact with a p-type clad layer while the low electric conductivity of the p-type clad layer provides current injection through a transparent ohmic contact layer having a low ohmic value without obstructions.

TLEDS generally have a structure wherein a nickel (Ni) layer and a gold (Au) layer are successively stacked over a p-type clad layer.

It is known that a Ni layer forms a semi-transparent ohmic contact layer having a specific contact resistance of $10^{-3}$ to $10^{-4}$ $\Omega cm^2$ through annealing in $O_2$ ambient.

The low specific contact resistance of the semi-transparent ohmic contact layer is formed between a Ni layer and a GaN forming a p-type clad layer and between the Ni layer and an Au layer when an annealing at a temperature of 500–600° C. is performed in $O_2$ ambient, thus resulting in lowering Schottky barrier height (SBH) and easily providing holes, being multiple carriers, onto around the surface of the p-type clad layer. Therefore, the effective carrier concentration in the vicinity of the p-type clad layer surface increases.

A Ni layer and a Au layer formed over a p-type clad layer show characteristics of ohmic conduction through annealing, wherein the reactivation process removing compounds among Mg—H metals and increasing the concentration of Mg dopant on the surface of GaN makes the effective carrier concentration more than $10^{19}$ $cm^{-3}$ on the surface of the p-type clad layer and causes a tunneling conduction between the p-type clad layer and the ohmic contact layer containing NiO.

TLEDS employing a semi-transparent electrode thin film made of Ni and Au have low light efficiency, thus making it difficult to realize a light emitting device having a large capacity and high brightness.

Recently, there is a need for developing FCLEDS using silver (Ag), aluminum (Al), rhodium (Rh), etc. which are spotlighted as materials for forming a high reflection layer, in order to realize a light emitting device having a large capacity and high brightness.

These metals have high reflective efficiency and thus provide high light emitting efficiency. However, the metals have small work function, resulting in making the life span of a light emitting device short because of the difficulty to form an ohmic contact having a low ohmic value and failing to provide a stable light emitting device because of the poor adhesive property to GaN.

To solve these problems, research on the structure of ohmic contact having a low ohmic value and high reflective efficiency are now under way.

For example, structures wherein indium oxide ($In_2O_3$) is stacked over a p-type clad layer have been disclosed in US patent publication Nos. 2003-0143772A1 and 2002-0179914A1. However, the structures have a high ohmic value.

SUMMARY OF THE INVENTION

The present invention provides a light emitting device having an electrode structure wherein a low ohmic value and high reflective efficiency are achieved and a method of manufacturing the light emitting device.

According to an aspect of the present invention, a light emitting device having a light emitting layer between an n-type clad layer and a p-type clad layer comprises: a reflective layer reflecting light emitted from the light emitting layer and an ohmic contact layer formed by adding an additional element to an indium oxide between the reflective layer and the p-type clad layer.

Examples of the additional element may include at least one element selected from the group consisting of Mg, Ag, Zn, Sc, Hf, Zr, Te, Se, Ta, W, Nb, Cu, Si, Ni, Co, Mo, Cr, Mn, Hg, Pr, and lanthanide (Ln).

The addition rate of the additional element to an indium oxide may be 0.1–49 atomic percent.

The reflective layer may be made of at least one selected from the group consisting of rhodium (Rh), Ag, and zinc (Zn).

The thickness of the ohmic contact layer may be 0.1–100 nm.

A substrate may be formed in the lower part of the n-type clad layer and be made of a material transmitting light.

According to another aspect of the present invention, there is provided a method of manufacturing a light emitting device having a light emitting layer between an n-type clad layer and a p-type clad layer, the method comprising: forming an ohmic contact layer by adding an additional element to an indium oxide on the p-type clad layer of a light emitting a structure wherein a n-type clad layer, light emitting layer, and a p-type clad layer are successively stacked on a substrate; and forming a reflective layer over the ohmic contact layer; annealing a resultant structure in which the reflective layer is formed.

Examples of the additional element in the process of forming the ohmic contact layer may include at least one element selected from the group consisting of Mg, Ag, Zn, Sc, Hf, Zr, Te, Se, Ta, W, Nb, Cu, Si, Ni, Co, Mo, Cr, Mn, Hg, Pr, and lanthanide (Ln).

The annealing may be done at a temperature between 200° C. and 700° C.

The annealing may be performed in gas ambient including at least one element selected from the group consisting of nitrogen, argon, helium, oxygen, hydrogen, and air in a reactor equipped with the stacked structure.

The annealing may be performed in vacuum condition of the interior of a reactor equipped with the resultant structure.

The annealing may be done for a period ranging between 10 seconds and 2 hours.

The ohmic contact layer may be formed with a device selected from the group consisting of an electron-beam evaporator, thermal evaporator, and dual-type thermal evaporator.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention now will be described more fully hereinafter with reference to the accompanying drawings, in which a light emitting device and a method of manufacturing the same in accordance with preferred embodiments of the invention are shown.

Figure 1:
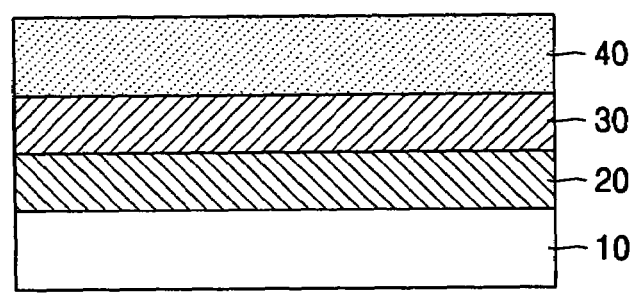
FIG. 1 is a sectional view of a p-type electrode structure in accordance with the present invention.

Referring to FIG. 1, a p-type electrode structure includes an ohmic contact layer 30 and a reflective layer 40.

FIG. 1 illustrates a structure wherein the ohmic contact layer 30 and the reflective layer 40 are successively stacked on a group III nitride based p-type clad layer 20 formed on a substrate 10 in order to experiment on the characteristics between a p-type electrode structure and a p-type clad layer requiring improved ohmic characteristics. The p-type clad layer is formed in opposition to the n-type clad layer each other centering around a light emitting layer of a group III nitride based light emitting device.

A group III nitride compound added with a p-type dopant can be used as the p-type clad layer 20. The group III nitride compound, for example, can be expressed as $Al_xIn_yGa_zN$ wherein $0 \leq x \leq 1, 0 \leq y \leq 1, 0 \leq z \leq 1$, and $0 \leq x+y+z \leq 1$. Examples of the p-type dopant include Mg, Zn, Ca, Sr, Ba, and the like.

The ohmic contact layer 30 is formed by adding a predetermined additional element for improving characteristics to an indium oxide, for example, $In_2O_3$. The additional element is preferably a material that can form the ohmic contact layer 30 having improved ohmic characteristics by controlling band gap, electron affinity, and work function of the indium oxide.

Metal increasing effective carrier concentration and having good preferential reactivity with components other than nitrogen among compounds composing the p-type clad layer 20 are employed as materials suitable for the additional element in the ohmic contact layer 30. For example, in case of employing GaN based compounds, the additional element that preferentially reacts with gallium (Ga) prior to nitrogen is added to the indium oxide in the ohmic contact layer 30.

For example, in case of the p-type clad layer 20 having GaN as a main component, Ga vacancy is formed over the surface of the p-type clad layer 30 through the reaction between Ga of the p-type clad layer 20 and the ohmic contact layer 30 because of the ohmic contact layer 30 having the above described characteristics. The Ga vacancy formed over the p-type clad layer 20 acts as a p-type dopant, thus increasing effective p-type carrier concentration on the surface of the p-type clad layer 20 by the reaction between the p-type clad layer 20 and the ohmic contact layer 30.

Also, materials that remain behind over the surface of the p-type clad layer in the forming process and are able to form transparent conductive oxide by reacting with gallium oxide $(Ga_2O_3)$, which is a natural oxide layer obstructing the flow of carriers in the interface between the p-type clad layer 20 and the ohmic contact layer 30, are employed in the ohmic contact layer 30.

In this case, it is possible to improve the ohmic characteristics by generating tunneling conduction in the interface between the ohmic contact layer 30 and the p-type clad layer 20.

The additional element added to $In_2O_3$ of the ohmic contact layer 30 can be at least one selected from the group consisting of Mg, Ag, Zn, Sc, Hf, Zr, Te, Se, Ta, W, Nb, Cu, Si, Ni, Co, Mo, Cr, Mn, Hg, Pr, and lanthanide (Ln).

The addition rate of the additional element to the indium oxide is preferably in the range of 0.1–49 atomic percent. The atomic percent refers to the rate between the numbers of the added element.

The thickness of the ohmic contact layer 30 is preferably in the range of 0.1–100 nm.

The reflective layer 40 is the uppermost layer of the p-type electrode structure. The reflective layer 40 may be formed using a material that has the restrained surface degradation in the range of 300–600° C., the temperature range generally applied in the process of manufacturing FCLEDS, is stable to oxidation, and has high reflective capability without changing the characteristics. For example, the reflective layer 40 can be formed of one selected from the group consisting of Rh, Ag, and Zn. The thickness of the reflective layer 40 may be 10–1000 nm. The ohmic contact layer 30 and the reflective layer 40 may be formed by an electron-beam evaporator. The ohmic contact layer 30 and the reflective layer 40 may be formed by various known evaporating methods except for the sputtering method, for example, physical vapor deposition (PVD), chemical vapor deposition (CVD), plasma laser deposition (PLD), thermal evaporator, dual-type thermal evaporator, and the like. The evaporation is performed at the range of 20–1500° C. and the pressure at the interior of the reactor is an atmosphere to about $10^{-12}$ torr.

The sputtering is difficult to apply because the GaN based p-type clad layer 30 is changed into an insulator due to the damage from plasma in the process of forming the p-type electrode structure.

The ohmic contact layer 30 and the reflective layer 40 undergo annealing process after the evaporation process.

Annealing is done at the temperature of 200–700° C. in vacuum or gas ambient for about 10 seconds to 2 hours.

In the annealing process, at least one element selected from the group consisting of nitrogen, argon, helium, oxygen, hydrogen, and air may be injected into the interior of a reactor.

A method of manufacturing the p-type electrode structure will be described in greater detail. The following method is not intended to limit the scope of the invention.

First, a structure, wherein the p-type clad layer 20 made up mainly of GaN is formed over the substrate, is washed in an ultrasonic bath at the temperature of 60° C. for 5 minutes respectively by trichloroethylene, acetone, methanol, and distilled water and undergoes hard baking at the temperature of 100° C. for 10 minutes in order to eliminate remaining water from the sample.

Then, photo-resist undergoes spin coating over the p-type clad layer 20 at 4.500 rpm. The photo-resist undergoes soft baking at the temperature of 85° C. for 15 minutes. A mask and the sample are aligned in order to develop a mask pattern and are exposed in ultraviolet rays (UV) of 22.8 mW for 15 seconds. The sample is soaked in the solution, wherein developing solution and distilled water are mixed at the rate of 1 to 4, for 25 seconds and is developed.

In order to eliminate the impure layer in the developed sample, the sample is soaked in BOE solution for 5 minutes. Then, the ohmic contact layer 30 is evaporated by an electron-beam evaporator.

The ohmic contact layer 30 is evaporated by mounting a reaction object, formed by mixing $In_2O_3$ powder with oxide magnesium (MgO) at the rate of 9 to 1 and sintering the mixture, at a reaction object mounting stage in the chamber of an electron-beam evaporator.

After the evaporation of the ohmic contact layer 30, the reflective layer 40 is evaporated by Ag and undergoes lift-off process with acetone. Then, an electrode structure is manufactured by annealing the sample in a rapid thermal annealing (RTA) furnace at the temperature of 330–530° C. for 1 minute.

The result of the experiment performed after the p-type electrode structure is formed on the p-type clad layer 20 having GaN as a main component now will be described more fully hereinafter with reference to FIGS. 2 through 4.

Figure 2:
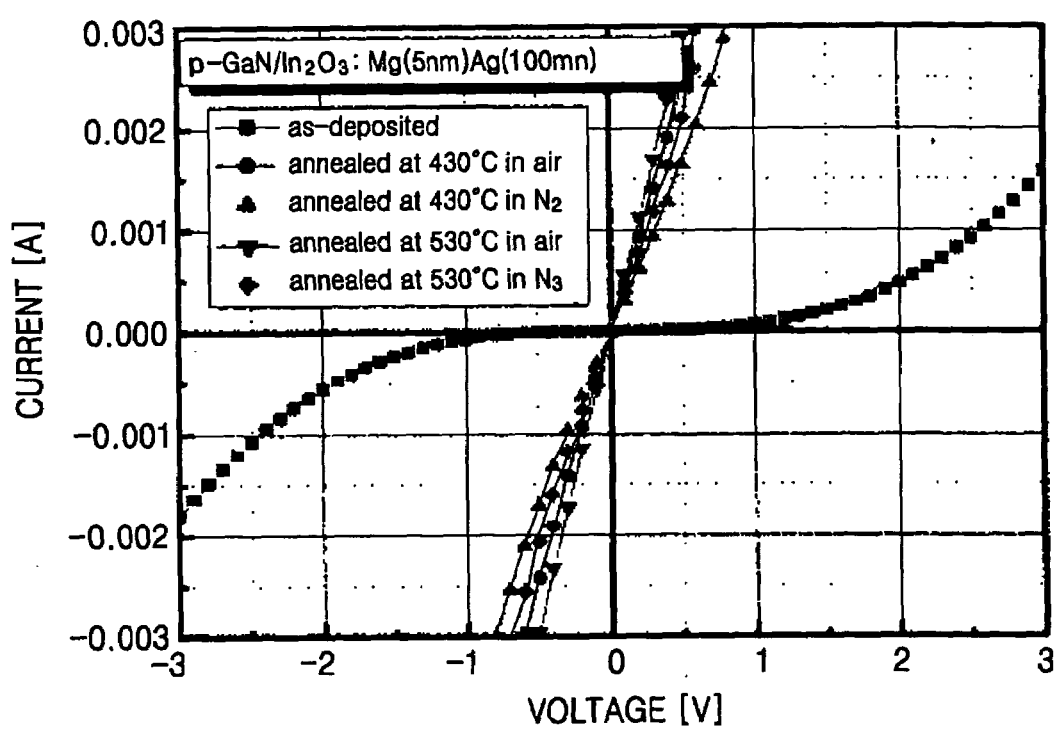
FIGS. 2 through 4 are a graph showing the characteristics of electric current and voltage measured before and after subjecting the p-type electrode structure, having different thickness of an ohmic contact layer and a reflective layer as shown in FIG. 1, to annealing.
Figure 3:
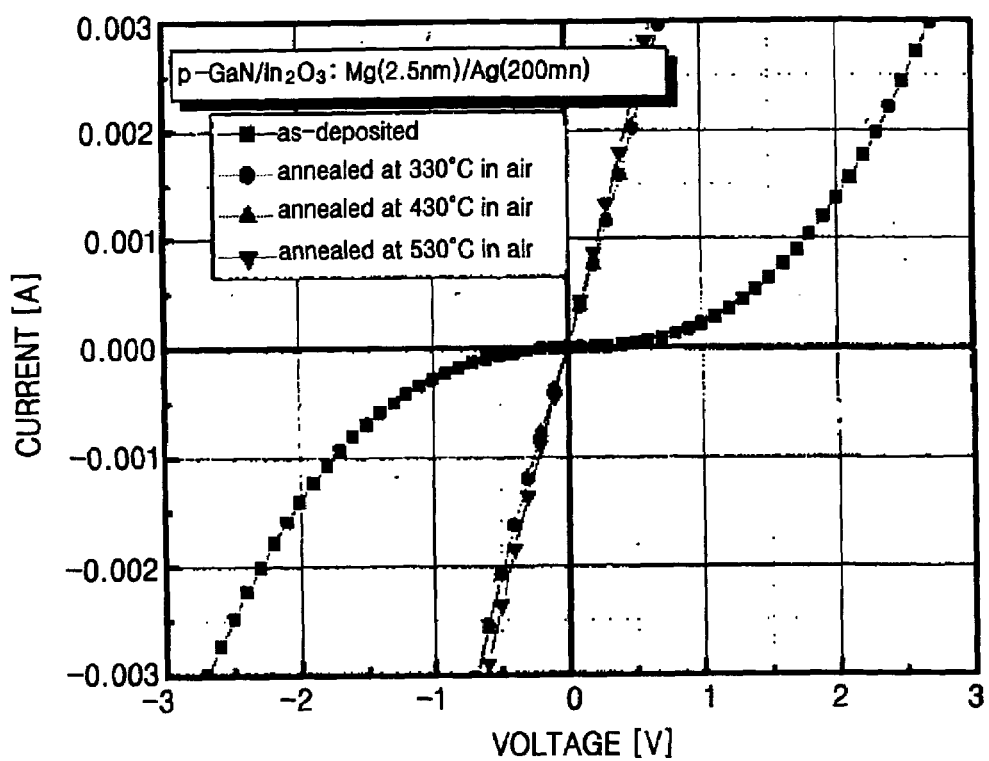
Figure 4:
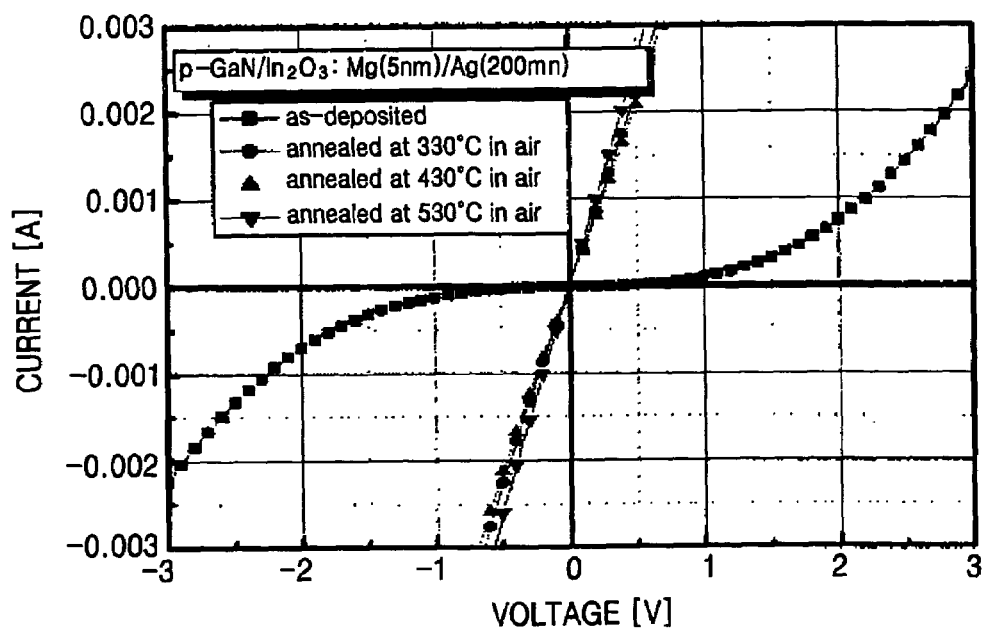

FIGS. 2 through 4 are a graph showing the result of measuring the electric characteristics of the ohmic contact layer 30 and the reflective layer 40 which were sequentially formed in different thickness on the p-type clad layer 20 having GaN of carrier concentration of $4\sim5\times10^{17}$ cm$^{-3}$ as a main component wherein the ohmic contact layer 30 was formed so that Mg is contained in the indium oxide and the reflective layer 40 was formed of Ag. Also, the ohmic contact layer 30 and the reflective layer 40 were annealed at the temperature of 330–530° C. in air ambient before the measure.

FIG. 2 is a graph showing the result of measuring the electric characteristics when the thicknesses of the ohmic contact layer 30 and the reflective layer 40 were 5 nm and 100 nm, respectively. FIG. 3 is a graph showing the result of measuring the electric characteristics when the thickness of the ohmic contact layer 30 was 2.5 nm and that of the reflective layer 40 was 200 nm. FIG. 4 is when the thickness of the ohmic contact layer 30 was 5 nm and that of the reflective layer 40 was 200 nm.

As shown in FIGS. 2 through 4, a non-linear current-voltage characteristic which signifies rectification behavior appeared before annealing, but a linear current-voltage characteristic which signifies ohmic contact behavior appeared after annealing. Also, the specific contact resistance was low, ranging from $10^{-4}$ to $10^{-5}$ Ωcm².

Figure 5:
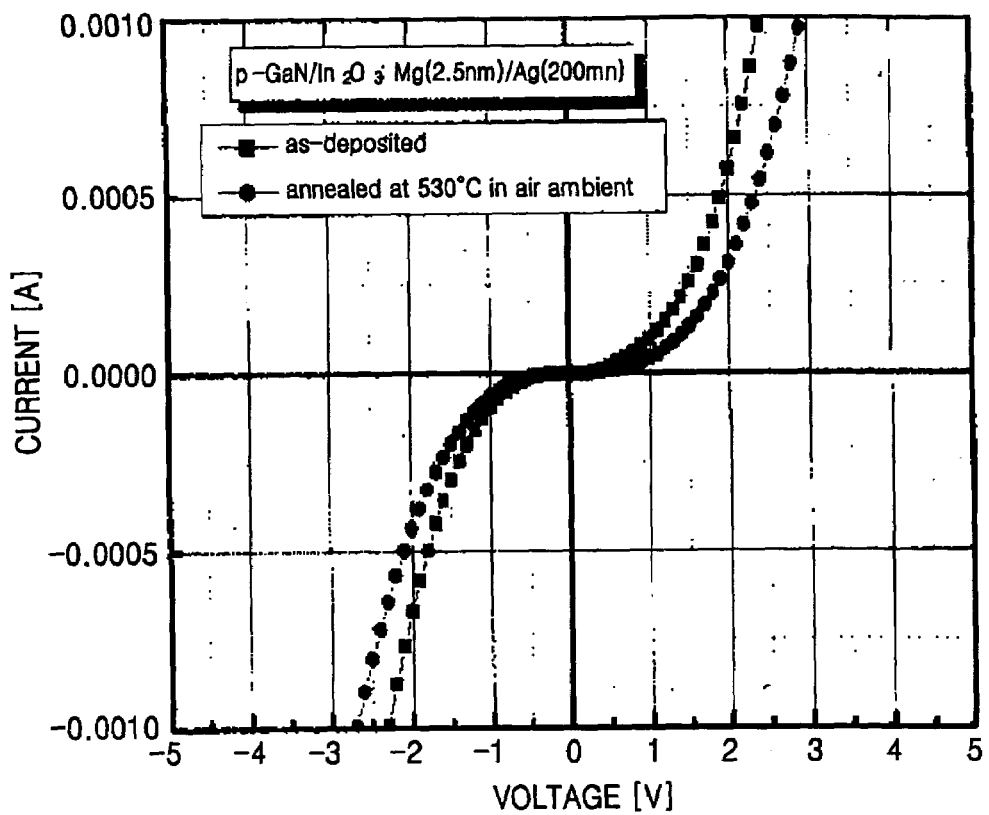
FIG. 5 is a graph showing the characteristics of electric current and voltage measured before and after annealing subsequently to forming an aluminum reflective layer over an indium oxide layer.
Figure 6:
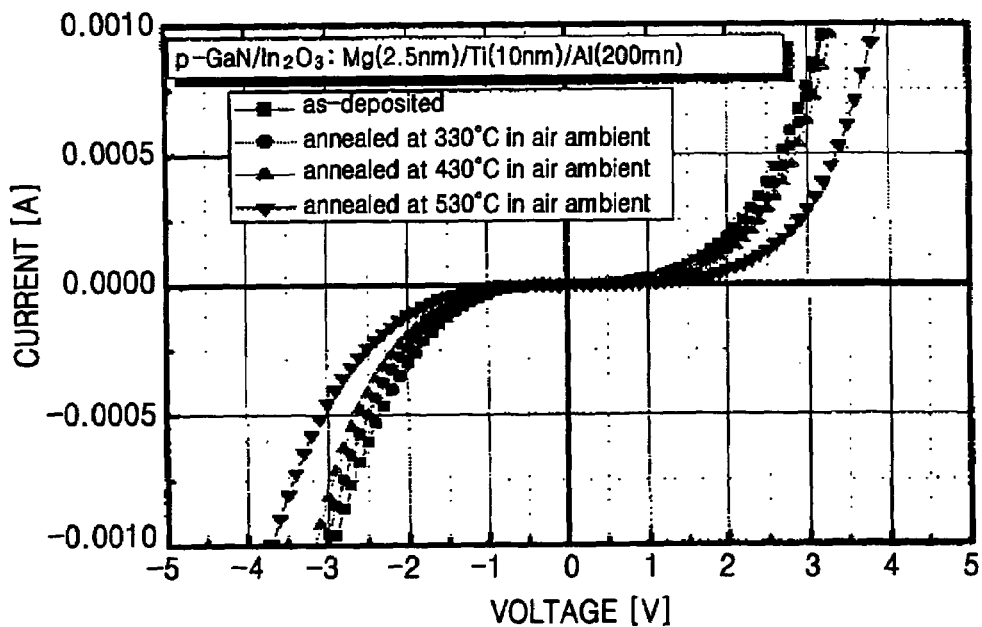
FIG. 6 is a graph showing the characteristics of electric current and voltage measured before and after subjecting a stacked structure, wherein a titanium (Ti) layer and an aluminum layer are successively stacked over an indium oxide layer added with an additional element, to annealing.

FIGS. 5 and 6 show the result of comparing the characteristics in such a case that an additional element was added to the indium oxide with the characteristics in a conventional case that no the additional element was added.

FIG. 5 shows the result of measuring the characteristics of electric current and voltage of the sample before and after annealing at the temperature of 530° C. in air ambient when an $In_2O_3$ layer was evaporated at the thickness of 2.5 nm over a p-type clad layer with $In_2O_3$ alone without adding any other element and a reflective layer was evaporated at the thickness of 200 nm on the $In_2O_3$ layer with aluminum.

As shown in FIG. 5, the characteristics of electric current and voltage were non-linear in the $In_2O_3$ layer without having any added element regardless of annealing.

FIG. 6 shows the result of measuring the characteristics of electric current and voltage of the sample before and after annealing at the temperature of 330–530° C. in air ambient when an ohmic contact layer with Mg added to $In_2O_3$ was deposited to the thickness of 2.5 nm on a p-type clad layer and a titanium layer was deposited to the thickness of 10 nm and a reflective layer was deposited to the thickness of 200 nm on the ohmic contact layer with aluminum.

As shown in FIG. 6, the characteristics of electric current and voltage were not linear regardless of annealing when the layer successively evaporated over the ohmic contact layer with an additional element added to $In_2O_3$ was not made of proper materials.

The function of ohmic contact layer 30 and the reflective layer 40 in accordance with the present invention is described in view of the results of the above comparison.

Material forming the ohmic contact layer 30 is oxide having high light transmittance and high conductivity. In this case, the ohmic contact layer 30 is formed by adding an additional element to $In_2O_3$ through doping or mixing in order to control band gap, electron affinity, and work function, which determine the electrical characteristics of the ohmic contact layer 30 in contact with the p-type clad layer 20. The ohmic contact layer 30 made of the oxide forms a transparent conductive oxide, GaInO3, in reaction with $Ga_2O_3$ that is an oxide layer existing over the upper part of the p-type clad layer 20 in the process of annealing. Then, the ohmic contact layer 30 forms Ga vacancy over the surface, thus increasing the effective hole concentration around the surface of the p-type clad layer 20. The formed oxide has considerably high work function value, resulting in lowering the height and width of SBH when it contacts with the p-type clad layer 20, thus improving the ohmic contact characteristics and providing light transmittance close to 100%.

Figure 7:
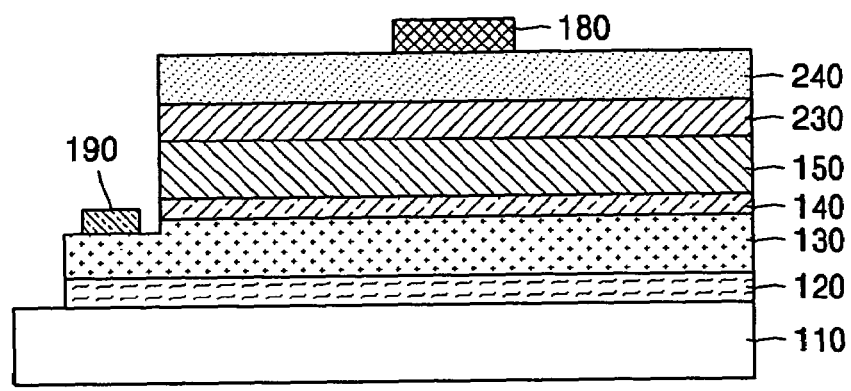
FIG. 7 is a sectional view of a light emitting device employing a p-type electrode structure in accordance with the invention.

FIG. 7 is a view showing an example of a light emitting device employing the p-type electrode structure of FIG. 1.

As shown in FIG. 7, the light emitting device has a structure wherein a substrate 110, a buffer layer 120, an n-type clad layer 130, a light emitting layer 140, a p-type clad layer 150, an ohmic contact layer 230, and a reflective layer 240 are successively stacked.

Reference numeral 180 denotes a p-type electrode pad and reference numeral 190 an n-type electrode pad.

The substrate 110 is made of a transparent material such as sapphire or silicon carbide (SiC).

The buffer layer 120 can be omitted.

Each layer from the buffer layer 120 to the p-type clad layer 150 is formed of mainly any one compound selected from the compounds expressed as a group III nitride based compounds, for example, $Al_xIn_yGa_zN (0 \leq x \leq 1, 0 \leq y \leq 1, 0 \leq z \leq 1,$ and $0 \leq x+y+z \leq 1)$. The appropriate dopant is added to the n-type clad layer 130 and the p-type clad layer 150. The light emitting layer 140 can be formed in various methods such as a single layer or a MQW layer.

For example, when GaN compound is applied, the buffet layer 120 is formed of GaN. The n-type clad layer 150 is formed by adding Si, Ge, Se, Te, and the like as an n-type dopant to GaN. The p-type clad layer 150 is formed by adding Mg, Zn, Ca, Sr, Ba, and the like as a p-type dopant to GaN.

Each layer is formed by the above described evaporation method, for example, PVD, CVD, PLD, thermal evaporator, dual-type thermal evaporator, and the like.

The ohmic contact layer 230 is formed by adding an additional element to $In_2O_3$ as shown in FIG. 1 and the reflective layer 240 is formed of one selected from the group consisting of Ag, Rh, and Zn. Then the layers undergo annealing.

One example of a process of manufacturing the light emitting device now will be described hereinafter.

The treatment of the surface of the p-type clad layer 150, which was exposed from a light emitting structure stacked with a substrate mainly formed of InGaN, a buffer layer, an n-type clad layer, a light emitting layer, and a p-type clad layer, and electron beam lithography process were same those of the example described with reference to FIG. 1 before evaporating a p-type electrode structure.

Light emitting diodes were manufactured by annealing at the temperature of 530° C. for 1 minute in air ambient after successively evaporating the ohmic contact layer 230 with $In_2O_3$, which contained Mg as an additional element after the surface treatment and the electron beam lithography process, and the reflective layer 240 with Ag by an electron beam evaporator, undergoing lift-off process with acetone, and putting a sample in a RTA.

Figure 8:
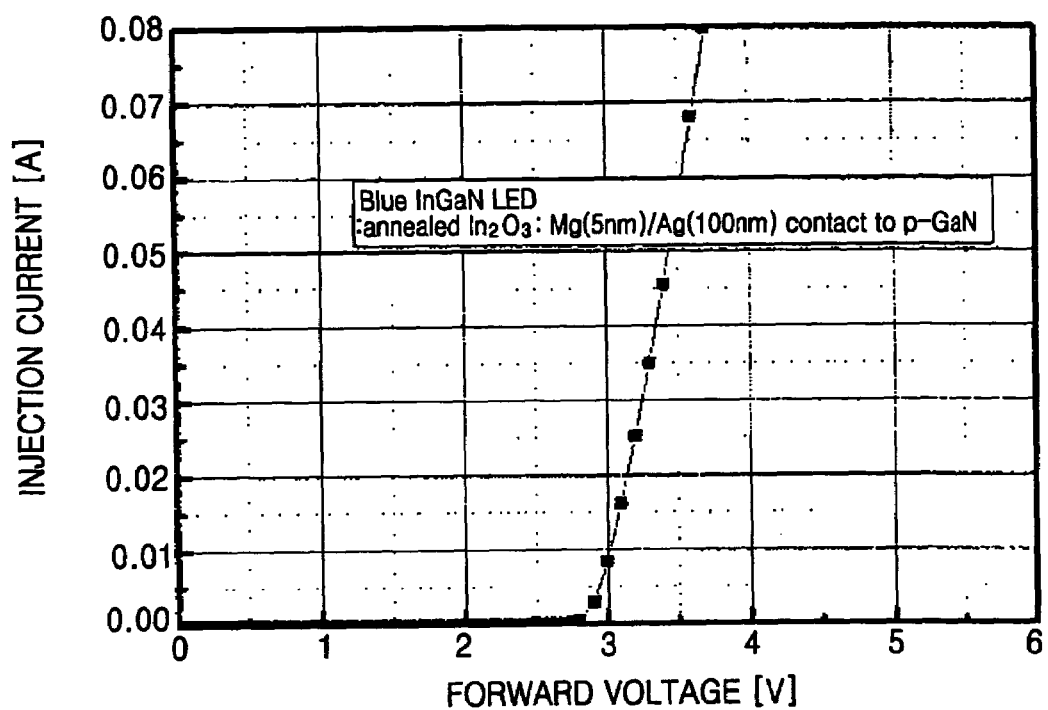
FIGS. 8 and 9 are a graph showing the result of measuring operating voltage of a blue light emitting diode having InGaN structure, which are manufactured by evaporating an ohmic contact layer and a reflective layer while making the thickness of the layers different from each other and by subjecting the layers to annealing in air ambient.
Figure 9:
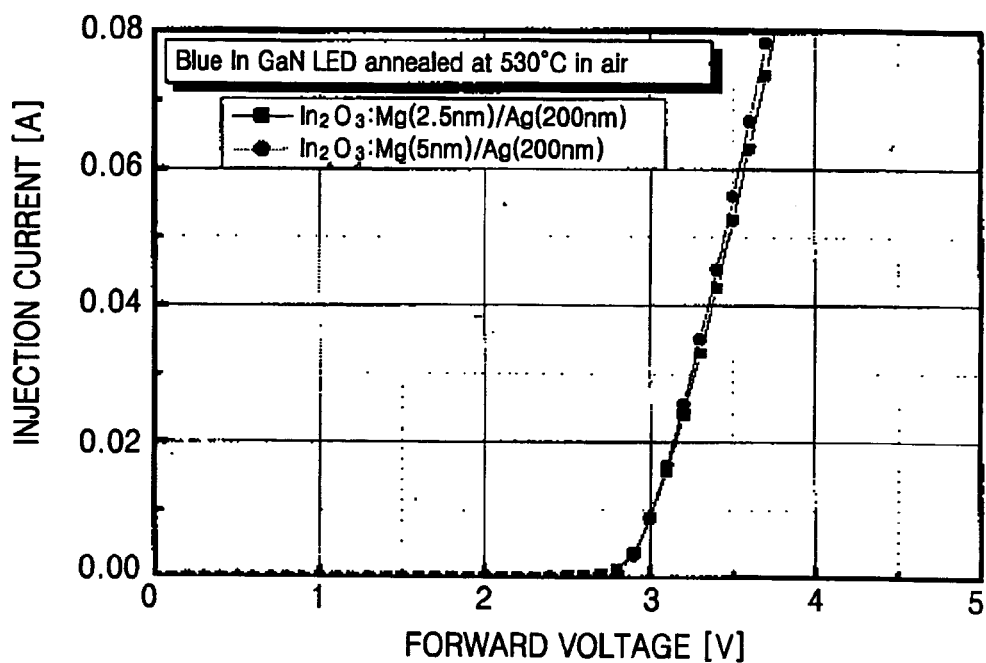

FIGS. 8 and 9 show the result from measuring the characteristics of operating voltage when the ohmic contact layer 230 and the reflective layer 240 in accordance with the invention were blue light emitting diodes having mainly InGaN. The annealing in this case was conducted at the temperature of 530° C. in air ambient.

FIG. 8 shows a case wherein the thickness of the ohmic contact layer 30 was 5 nm and that of the reflective layer 40 was 100 nm.

FIG. 9 shows the result of measuring the characteristics of electric current and voltage in each case that the thickness of the ohmic contact layer 30 was 2.5 nm and 5 nm respectively while the thickness of the reflective layer 40 was 200 nm.

As shown in FIGS. 8 and 9, a light emitting device employing a p-type electrode structure of the invention has improved operating characteristics considering the fact that operating voltage at 20 mA was 3.14–3.15V.

Figure 10:
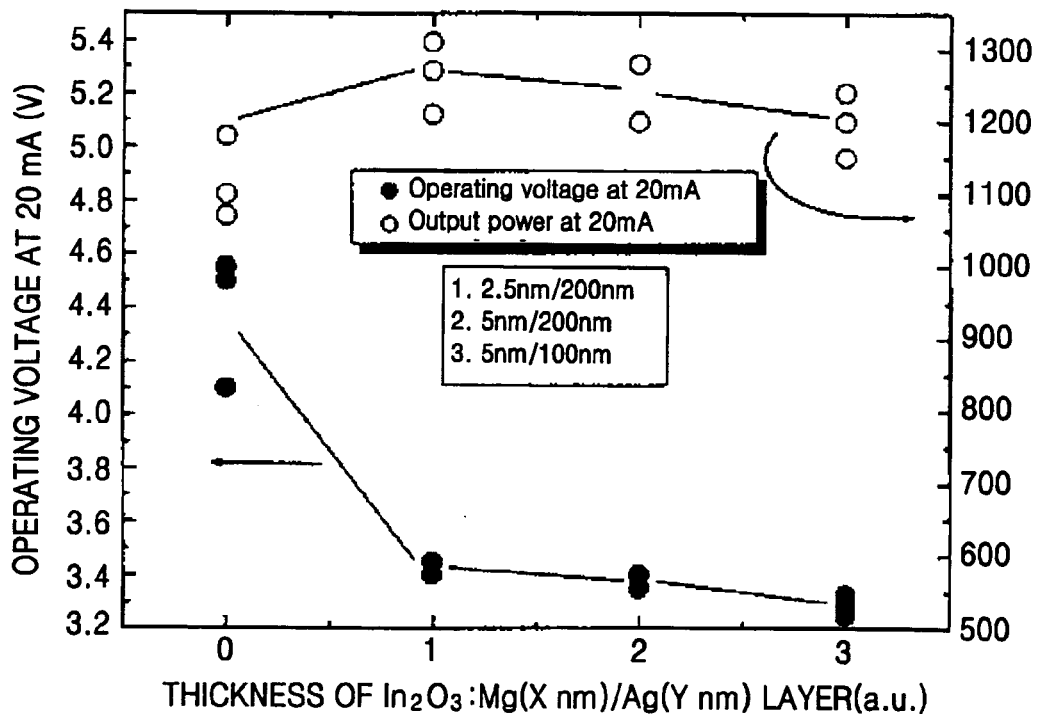
FIG. 10 is a graph showing the relationship between the operating voltage and output power of an InGaN based blue light emitting diode having a MQW structure manufactured by evaporating an ohmic contact layer and a reflective layer while making the thickness of the layers different from each other and by subjecting the layers to annealing in air ambient.

FIG. 10 shows the results of measuring the relationship between operating voltage and output power after annealing the ohmic contact layer 230 having different thickness over the p-type clad layer 150 in air ambient. In this case, InGaN blue light emitting diodes have a packaged MQW structure.

As shown in FIG. 10, the output power changes depending on the thickness of the ohmic contact layer 230 and that of the reflective layer 240 with Ag.

Therefore, it is desirable to adjust the thickness of the ohmic contact layer 230 and that of the reflective layer 240 appropriately depending on the desired characteristics of a light emitting device.

As described above, in a light emitting device and a method of manufacturing the same in accordance with the present invention, the characteristics of ohmic contact with a p-type clad layer is improved, thus increasing the efficiency and yield of wire bonding during packaging FCLEDS. Also, it is possible to increase the light emitting efficiency and life span of light emitting devices due to the low contactless resistance and the excellent electric current and voltage characteristic.

What is claimed is:

1. A light emitting device having a light emitting layer between an n-type clad layer and a p-type clad layer, the light emitting device comprising:
    a reflective layer reflecting the light emitted from the light emitting layer; and an ohmic contact layer formed by adding an additional element to an indium oxide between the reflective layer and the p-type clad layer, wherein the thickness of the ohmic contact layer is 0.1–20 nm.

2. The light emitting device of claim 1, wherein the additional element includes at least one element selected from the group consisting of Mg, Ag, Zn, Sc, Hf, Zr, Te, Se, Ta, W, Nb, Cu, Si, Ni, Co, Mo, Cr, Mn, Hg, Pr, and lanthanide.

3. The light emitting device of claim 1, wherein the additional element is added in an amount of 0.1–49 atomic percent of the indium oxide.

4. The light emitting device of claim 1, wherein the reflective layer is formed of one selected from the group consisting of Rh, Ag, and Zn.

5. The light emitting device of claim 1, wherein a substrate is formed in the lower part of the n-type clad layer and is formed of a material that can transmit light.

6. The light emitting device of claim 5, wherein the substrate is made of sapphire.

* * * * *

UNITED STATES PATENT AND TRADEMARK OFFICE
CERTIFICATE OF CORRECTION

PATENT NO. : 7,205,576 B2  Page 1 of 1
APPLICATION NO. : 10/930915
DATED : April 17, 2007
INVENTOR(S) : June-o Song et al.

It is certified that error appears in the above-identified patent and that said Letters Patent is hereby corrected as shown below:

On the Title page, please correct the Assignee's Information from:

Item "(73)   Assignee: Samsung Electronics Co., Ltd."

to:

Item --(73)   Assignees:   Samsung Electronics Co., Ltd.
Suwon-si, Gyeonggi-do (KR) and
Gwangju Institute of Science and Technology
Buk-gu, Gwangju-shi (KR)--

Signed and Sealed this

Twenty-fifth Day of May, 2010

David J. Kappos
*Director of the United States Patent and Trademark Office*